US008975761B2

(12) United States Patent
Jung (10) Patent No.: US 8,975,761 B2
(45) Date of Patent: Mar. 10, 2015

(54) ORGANIC LIGHT-EMITTING DISPLAY COMPRISING A SUBSTRATE HAVING A FAN-OUT UNIT CONFIGURED TO CONNECT A DISPLAY REGION WITH A PAD UNIT

(71) Applicant: Samsung Display Co., Ltd., Yongin, Gyeonggi-do (KR)

(72) Inventor: Young-Bae Jung, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 13 days.

(21) Appl. No.: 13/839,735

(22) Filed: Mar. 15, 2013

(65) Prior Publication Data
US 2014/0117320 A1 May 1, 2014

(30) Foreign Application Priority Data

Oct. 26, 2012 (KR) ........................ 10-2012-0119790

(51) Int. Cl.
*H01L 23/48* (2006.01)
(52) U.S. Cl.
USPC ............. 257/786; 257/59; 257/208; 257/698; 257/E23.168; 345/55; 345/204
(58) Field of Classification Search
CPC ................ H01L 27/124; H01L 23/522; H01L 2224/73265; H01L 2224/24105
USPC ............ 257/59, 692, 773, 776, 786, 91, 208, 257/698, E23.168, E23.011
See application file for complete search history.

(56) References Cited

U.S. PATENT DOCUMENTS

| | | | | |
|---|---|---|---|---|
| 2007/0134883 | A1* | 6/2007 | Lee et al. | 438/398 |
| 2008/0203391 | A1* | 8/2008 | Kim et al. | 257/59 |
| 2009/0153765 | A1* | 6/2009 | Yamashita et al. | 349/58 |
| 2010/0193794 | A1* | 8/2010 | Kim et al. | 257/59 |

FOREIGN PATENT DOCUMENTS

| | | |
|---|---|---|
| KR | 10-2003-0065812 A | 8/2003 |
| KR | 10-2006-0028519 A | 3/2006 |
| KR | 10-2006-0059745 A | 6/2006 |

* cited by examiner

*Primary Examiner* — Marcos D. Pizarro
*Assistant Examiner* — Cesar Lopez
(74) *Attorney, Agent, or Firm* — Knobbe, Martens, Olson & Bear, LLP (57) ABSTRACT

A display apparatus and an organic display apparatus are disclosed. In one aspect, the display apparatus includes a display substrate divided into a display region for displaying an image via a plurality of pixels for emitting light and a non-display region around the display region. It includes a pad unit formed on the non-display region. It also includes a fan-out unit for connecting the display region and the pad unit. It further includes a plurality of line groups sequentially formed, wherein each line group includes a first fan-out line, a second fan-out line insulated from the first fan-out line by a first insulating layer, and a third fan-out line insulated from the second fan-out line by a second insulating layer, and wherein the third fan-out line at least partially overlaps with at least one of the first and second fan-out lines.

25 Claims, 4 Drawing Sheets

ORGANIC LIGHT-EMITTING DISPLAY COMPRISING A SUBSTRATE HAVING A FAN-OUT UNIT CONFIGURED TO CONNECT A DISPLAY REGION WITH A PAD UNIT

CROSS-REFERENCE TO RELATED APPLICATIONS

This application claims the benefit of Korean Patent Application No. 10-2012-0119790, filed on Oct. 26, 2012, in the Korean Intellectual Property Office, the disclosure of which is incorporated herein in its entirety by reference.

BACKGROUND

1. Field of the Technology

The described technology generally relates to a display apparatus including a pad unit and a fan-out unit formed on a non-display region around a display region for displaying an image, and an organic light-emitting display apparatus.

2. Description of the Related Technology

Currently, portable and thin flat panel displays dominate the display industry. Popular types of flat panel display technologies include liquid crystal display (LCD), which is a light-receiving-type display, and organic electroluminescence display and plasma display, which are light-emitting-type of display.

In a flat panel display, a substrate is divided into a display region, and a non-display region around the display region. A pad unit and a fan-out unit are formed on the non-display region. The fan-out unit is used for connecting the pad unit and the display region, and the fan-out unit includes fan-out lines for transmitting signals from a driver integrated chip (IC) that is mounted on the pad unit.

Since the fan-out lines are formed in the same layer by using a gate metal, a small panel and a high-resolution panel often have the problem of limited space for display. However, a large fan-out unit often increases dead space. In addition, a multiplexer (MUX) that is used to reduce the number of fan-out lines in the fan-out unit may not be used in a high-resolution display.

Accordingly, a design for arranging fan-out lines under a spatial limitation without forming a MUX is needed.

SUMMARY OF CERTAIN INVENTIVE ASPECTS

One inventive aspect is a display apparatus in which the arrangement of fan-out lines of a fan-out unit is improved, and an organic light-emitting display apparatus.

Another aspect is a display apparatus including a display substrate divided into a display region for displaying an image via a plurality of pixels configured to emit light, and a non-display region around the display region; a pad unit formed on the non-display region; and a fan-out unit configured to connect the display region and the pad unit and including a plurality of line groups sequentially formed and each including a first fan-out line, a second fan-out line insulated from the first fan-out line by a first insulating layer, and a third fan-out line insulated from the second fan-out line by a second insulating layer, wherein the third fan-out line at least partially overlaps with at least one of the first and second fan-out lines.

In some embodiments, the first through third fan-out lines may be alternately formed.

The first through third fan-out lines may transmit signals to different types of pixels.

Fan-out lines included in a plurality of line groups and formed at the same layer may transmit signals to the same type pixels.

The display region may include a plurality of first gate lines configured to extend in a first direction; a plurality of second gate lines insulated from the first gate lines by the first insulating layer and configured to extend in a second direction that crosses the first direction; and a plurality of data lines insulated from the second gate lines by the second insulating layer and configured to extend in the second direction, and each of the first through third fan-out lines may be electrically connected to one of the data lines.

The pixels may be formed at intersections where the first gate lines cross with the data lines and where the second gate lines cross with the data lines, each of the pixels may include a first pixel configured to emit light of a first color, a second pixel configured to emit light of a second color, and a third pixel configured to emit light of a third color, and the first fan-out line may be electrically connected to the data line of the first pixel, the second fan-out line may be electrically connected to the data line of the second pixel, and the third fan-out line may be electrically connected to the data line of the third pixel.

The first fan-out line may transmit a first data signal, the second fan-out line may be configured to transmit a second data signal, and the third fan-out line may be configured to transmit a third data signal.

The first fan-out line may be formed at the same layer as the first gate line, the second fan-out line may be formed at the same layer as the second gate line, and the third fan-out line may be formed at the same layer as the data line.

The first through third fan-out lines may be formed of one or more materials selected from the group consisting of molybdenum (Mo), aluminum (Al), copper (Cu), silver (Ag), titanium (Ti), and transparent conductive oxide (TCO).

The first through third fan-out lines may be formed of different materials and each of the first through third fan-out lines is formed of at least one material.

The same fan-out lines included in a plurality of line groups may be formed of the same material.

The display apparatus may further include a third insulating layer formed to cover the third fan-out line.

The third insulating layer may be formed on the display region, and the display apparatus may further include a display device formed on the third insulating layer of the display region.

The pad unit may include a first pad connected to the first fan-out line; a second pad connected to the second fan-out line; and a third pad connected to the third fan-out line, and the first through third pads may be formed diagonally offset from each other.

According to another inventive aspect, an organic light-emitting display apparatus includes a display substrate divided into a display region for displaying an image, and a non-display region around the display region; a plurality of first gate lines formed on the display region and extending in a first direction; a plurality of second gate lines formed on the display region, insulated from the first gate lines by a first insulating layer, and extending in a second direction that crosses the first direction; a plurality of data lines formed on the display region, insulated from the second gate lines by a second insulating layer, and extending in the second direction; a plurality of pixels wherein each of the pixels includes a pixel circuit unit that is electrically connected to the first or second gate line and the data line; an organic light-emitting device (OLED) included in each of the pixels, that is electrically connected to the pixel circuit unit, and configured to emit light; a pad unit formed on the non-display region; and a fan-out unit configured to connect the display region and the pad unit and including a plurality of line groups sequentially formed and each including a first fan-out line, a second fan-out line insulated from the first fan-out line by the first insulating layer, and a third fan-out line insulated from the second fan-out line by the second insulating layer, wherein the third fan-out line at least partially overlaps with at least one of the first and second fan-out lines.

DETAILED DESCRIPTION OF CERTAIN INVENTIVE EMBODIMENTS

Hereinafter, the described technology will be explained in detail using embodiments of the invention with reference to the attached drawings. The described technology may, however, be embodied in many different forms and should not be construed as being limited to the embodiments set forth herein.

For clarity of description, portions not related to the description are omitted and the same reference numerals denote the same or like elements throughout.

Also, sizes and thicknesses of elements illustrated in the drawings are provided for convenience of explanation and thus do not limit the scope of the described technology.

In the drawings, the thicknesses of layers and regions are exaggerated for clarity. It will be understood that when a layer is referred to as being "on" another layer or substrate, it can be directly on the other layer or substrate, or intervening layers may also be present.

It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. Also, the term "on" refers to an upper or lower side of a target and does not always mean an upper side in a direction of gravity.

A display apparatus according to an embodiment will now be described with reference to the attached drawings. Although the display apparatus is described as an organic light-emitting display apparatus below, the described technology is not limited thereto and may be applied to any display apparatus including a fan-out unit, for example, a liquid crystal display apparatus.

Figure 1:
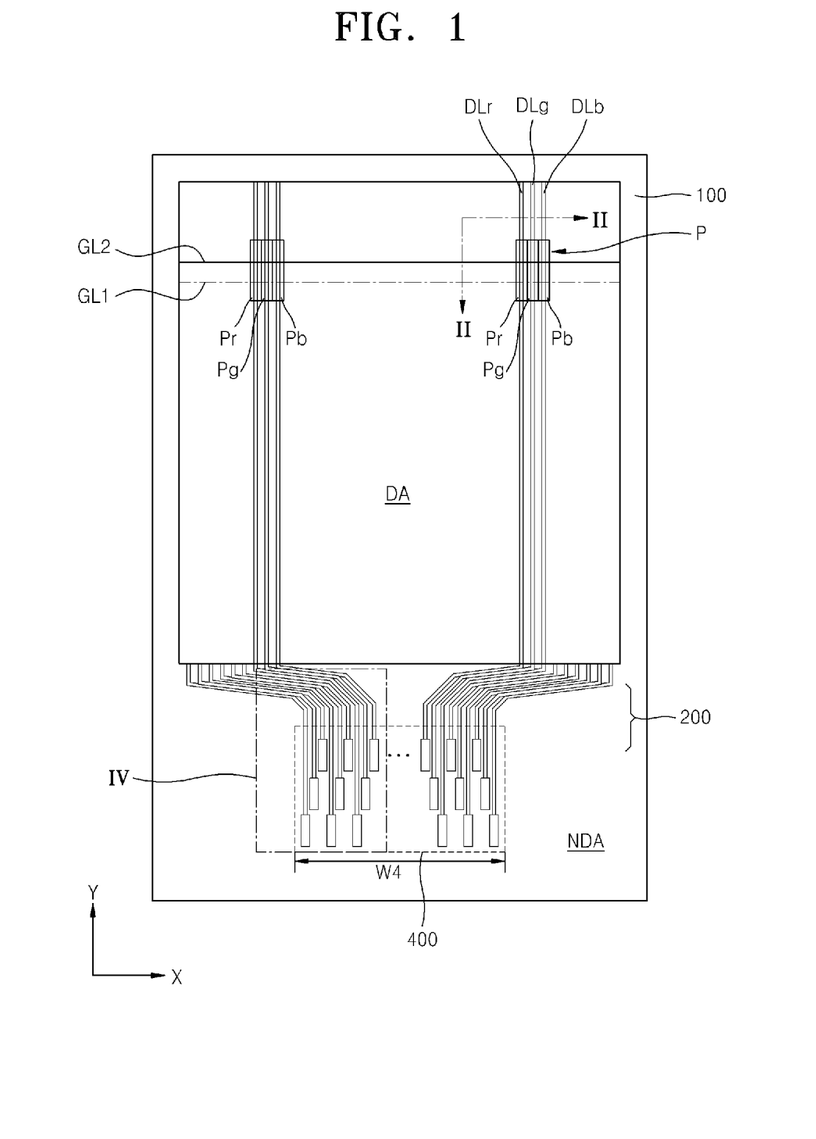
FIG. 1 is a schematic view of a display substrate of an organic light-emitting display apparatus, according to an embodiment.
Figure 2:
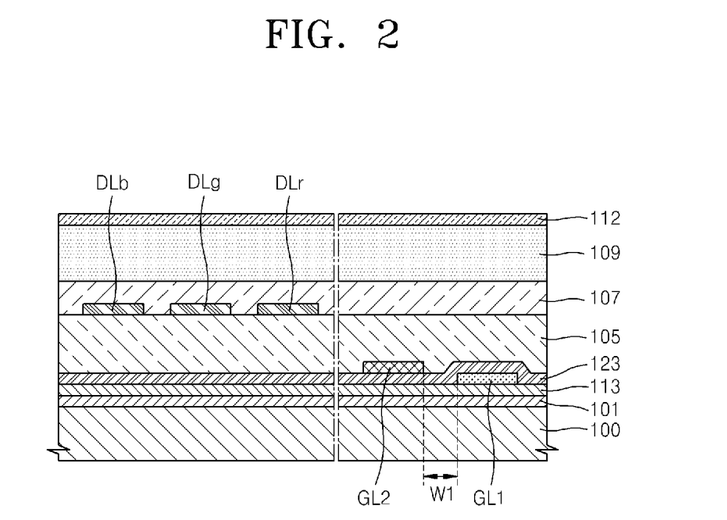
FIG. 2 is a cross-sectional view taken along line II-II of FIG. 1.
Figure 3:
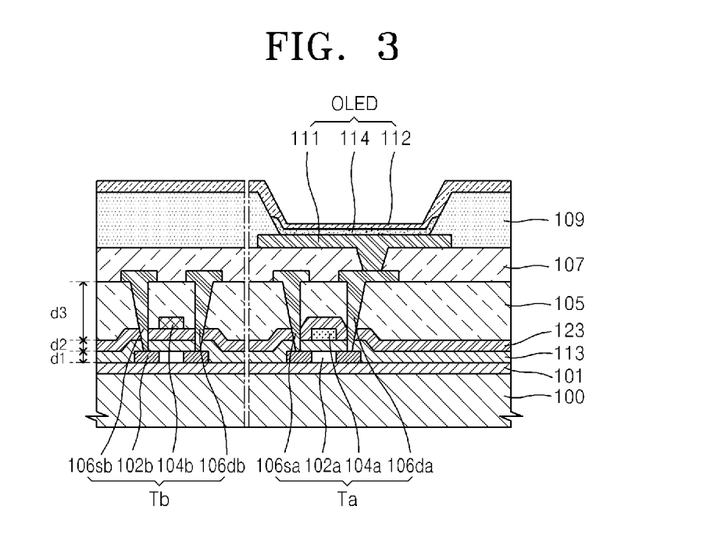
FIG. 3 is a magnified view of a pixel portion of FIG. 1.
Figure 4:
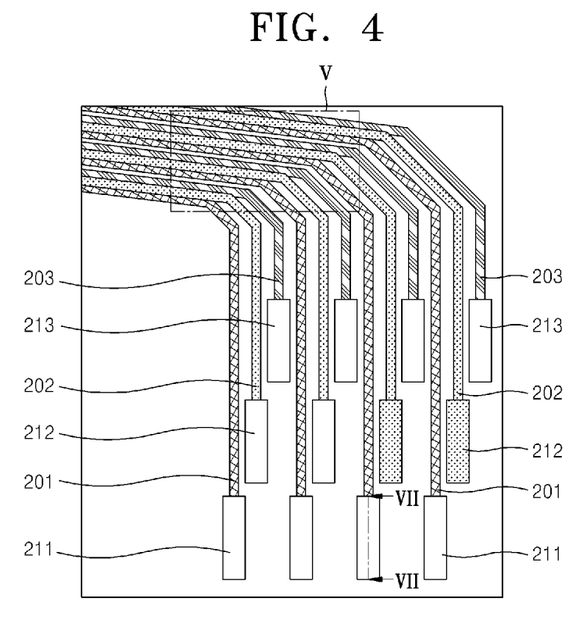
FIG. 4 is a magnified view of portion IV of FIG. 1.
Figure 5:
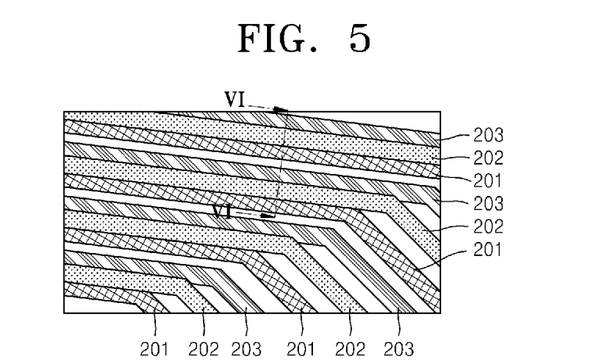
FIG. 5 is a magnified view of portion V of FIG. 4.
Figure 6:
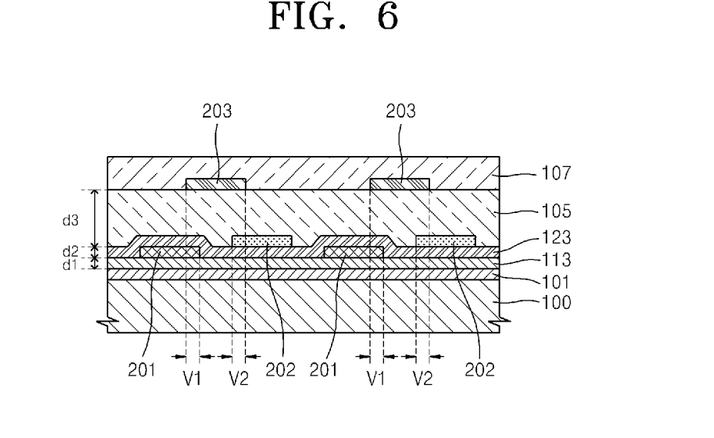
FIG. 6 is a cross-sectional view taken along line VI-VI of FIG. 5.
Figure 7:
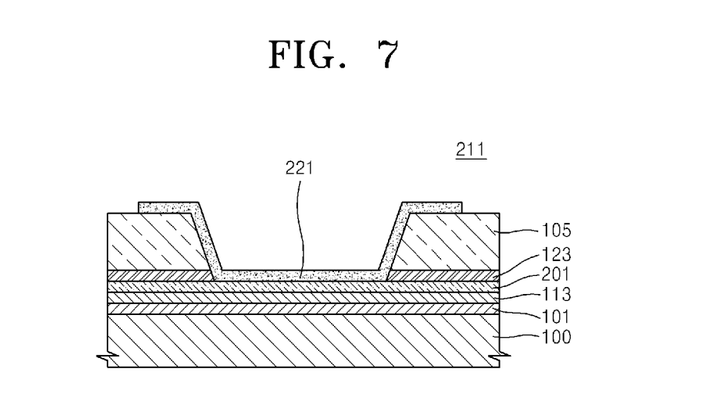
FIG. 7 is a cross-sectional view taken along line VII-VII of FIG. 4.

FIG. 1 is a schematic view of a display substrate 100 of an organic light-emitting display apparatus, according to an embodiment. FIG. 2 is a cross-sectional view taken along line II-II of FIG. 1. FIG. 3 is a magnified view of a pixel portion of FIG. 1. FIG. 4 is a magnified view of portion IV of FIG. 1. FIG. 5 is a magnified view of portion V of FIG. 4. FIG. 6 is a cross-sectional view taken along line VI-VI of FIG. 5. FIG. 7 is a cross-sectional view taken along line VII-VII of FIG. 4.

Referring to FIG. 1, the organic light-emitting display apparatus according to an embodiment includes the display substrate 100 and a sealing substrate (not shown). The display substrate 100 is divided into a display region DA for displaying an image, and a non-display region NDA around the display region DA. Although not shown, a sealing member surrounding the display region DA is formed on the non-display region NDA to seal the display region DA from the air. However, if the sealing substrate is a thin encapsulation film, the sealing member may be omitted. The sealing substrate is formed to face the display substrate 100 with respect to the sealing member, but is not illustrated in FIG. 1. Hereinafter, the display substrate 100 having the features of some embodiments is described in detail.

The display region DA of the display substrate 100 will now be described in detail with reference to FIGS. 1 through 3.

Referring to FIGS. 1 through 3, the display region DA is a region on which an image is displayed and on which various signal lines and pixels P that are connected to the signal lines are formed. The signal lines include first gate lines GL1 and second gate lines GL2 extending in a first direction and a first, second, and third data lines DLr, DLg, and DLb extending in a second direction, and the pixels P (Pr, Pg, and Pb) are formed at intersections where the first and second gate lines GL1 and GL2 cross with the first through third data lines DLr, DLg, and DLb.

The first gate lines GL1 are formed on a first gate insulating layer 113 and extend in the first direction, e.g., an X direction. The first gate lines GL1 may non-restrictively include a previous scan line and an emission control line. The first gate lines GL1 may be non-restrictively connected to a gate driving unit (not shown) or an emission control driving unit (not shown) to receive a scan signal or an emission control signal.

The second gate lines GL2 are insulated from the first gate lines GL1 by a second gate insulating layer 123 and extend in the first direction. The second gate lines GL2 may non-restrictively include a scan line and an initialization power line. The second gate lines GL2 may be non-restrictively connected to a gate driving unit (not shown) or an initialization power driving unit (not shown) to receive a scan signal or initialization power.

The first and second gate lines GL1 and GL2 do not overlap with each other. As described above, on the display substrate 100 according to an embodiment, since the first and second gate lines GL1 and GL2 are located at different layers of the second gate insulating layer 123, a distance W1 between adjacent gate lines located at different layers may be small and thus a larger number of pixels P may be formed on the same area. That is, a high-resolution display apparatus may be formed.

The types of signal lines formed by the first and second gate lines GL1 and GL2, the types of signals transmitted by the signal lines, and the types, number, and locations of driving units that are connected to the signal lines are not limited to the above description and the illustrations of FIGS. 1 through 3, and may be variously applied and changed according to design.

The first, second, and third data lines DLr, DLg, and DLb are insulated from the first and second gate lines GL1 and GL2 by an interlayer insulating layer 105 and extend in the second direction crossing the first direction, e.g., a Y direction. The first through third data lines DLr, DLg, and DLb are connected via fan-out lines of a fan-out unit 200 to a driver integrated chip (IC) (not shown) that is mounted on the non-display region NDA. The first through third data lines DLr, DLg, and DLb receive data signals from the driver IC via the fan-out lines.

Among the first through third data lines DLr, DLg, and DLb, the first data line DLr transmits a first data signal for a red pixel Pr to emit light, the second data line DLg transmits a second data signal for a green pixel Pg to emit light, and the third data line DLb transmits a third data signal for a blue pixel Pb to emit light. However, the types of data signals and data lines depend on the types of pixels, which depend on the colors of light emitted from the pixels. The colors of the light emitted from the pixels may non-restrictively include purple and white as well as red, green, and blue.

In some embodiments, the pixels P may be formed at intersections where the first and second gate lines GL1 and GL2 cross with the first through third data lines DLr, DLg, and DLb. Although the pixels P have a stripe structure in FIG. 1, the pixels P are not limited thereto and may also have a quad structure. For example, in the pixels P, the red, green, and blue pixels Pr, Pg, and Pb may form one unit pixel.

In an embodiment, the number of sub pixels included in a unit pixel is three because lines of the fan-out unit 200 are formed at three layers. However, if the number of layers at which the lines of the fan-out unit 200 are formed is increased, the number of sub pixels included in a unit pixel may also be increased. In some embodiments, added sub pixels may be blue or white pixels.

In other embodiments, each pixel P may include an organic light-emitting device (OLED) for emitting light with a luminance corresponding to a driving current of a data signal, and a pixel circuit for controlling the driving current flowing through the OLED. The pixel circuit is connected to each of the first and second gate lines GL1 and GL2 and the first through third data lines DLr, DLg, and DLb. The OLED is connected to the pixel circuit. The pixel circuit may include a first and a second thin film transistors (TFTs) Ta and Tb and at least one capacitor (not shown).

The structure of a pixel including a pixel circuit and an OLED will now be described in detail with reference to FIG. 3.

Only one of the pixels P of FIG. 1 is illustrated in FIG. 3 and the other pixels P have the same structure and thus are not repeatedly described here. Also, although two TFTs and an OLED are included in the pixel in FIG. 3, the pixel may further include an additional TFT and a capacitor.

The pixel is formed on the display substrate 100. The display substrate 100 may be formed of glass, plastic, or metal.

A buffer layer 101 for providing a flat surface on the display substrate 100 is formed on the display substrate 100, wherein the buffer layer 101 includes an insulator to prevent penetration of moisture and foreign substances into the display substrate 100.

A pixel circuit is formed on the buffer layer 101, and the OLED is connected to the pixel circuit, wherein the pixel circuit includes the first and second TFTs Ta and Tb and a capacitor (not shown). The first and second TFTs Ta and Tb mainly and respectively include first and second active layers 102a and 102b, first and second gate electrodes 104a and 104b, and first and second source/drain electrodes 106sa and 106da, and 106sb and 106db. The first and second TFTs Ta and Tb are characterized in that the first and second gate electrodes 104a and 104b are formed at different layers.

In some embodiments, in the first TFT Ta, the first active layer 102a may be formed in a predetermined pattern on an upper surface of the buffer layer 101. The first active layer 102a may be formed of an inorganic semiconductor material such as silicon, an organic semiconductor material, or an oxide semiconductor material, and may be formed by injecting a p-type or n-type dopant. The first gate insulating layer 113 is formed on the first active layer 102a. The first gate electrode 104a is formed on the first gate insulating layer 113 to correspond to the first active layer 102a. The second gate insulating layer 123 and the interlayer insulating layer 105 are formed to cover the first gate electrode 104a, and the first source electrode 106sa and the first drain electrode 106da are formed on the interlayer insulating layer 105 to respectively contact predetermined regions of the first active layer 102a.

In the second TFT Tb, the second active layer 102b is formed in a predetermined pattern on the upper surface of the buffer layer 101, and the first and second gate insulating layers 113 and 123 are formed on the second active layer 102b. The second gate electrode 104b is formed on the second gate insulating layer 123 to correspond to the second active layer 102b. The interlayer insulating layer 105 is formed to cover the second gate electrode 104b, and the second source electrode 106sb and the second drain electrode 106db are formed on the interlayer insulating layer 105 to respectively contact source and drain regions of the second active layer 102b.

In some embodiments, the interlayer insulating layer 105 may be formed as a single or multiple layers by using an inorganic material such as silicon oxide or silicon nitride. Since a thickness d3 of the interlayer insulating layer 105 is greater than a thickness d1 of the first gate insulating layer 113 or a thickness d2 of the second gate insulating layer 123, surface planarization may be achieved and a parasitic capacitance between the first source/drain electrodes 106sa and 106da, and the second source/drain electrodes 106sb and 106db and lower conductive layers (e.g. gate electrode layer) may be prevented.

As described above, since a gate insulating layer thickness (d1) between the first gate electrode 104a and the first active layer 102a in the first TFT Ta is different from a gate insulating layer thickness (d1+d2) between the second gate electrode 104b and the second active layer 102b in the second TFT Tb, the following effects may be achieved. If a TFT that is used as a driving TFT has a thicker gate insulating layer, light emitted from the OLED may be controlled to have a richer gradation by varying the size of the gate voltage Vgs applied to a gate electrode of the driving TFT because a driving range of a gate voltage Vgs is increased. Also, since a TFT used as a switching TFT has a thin gate insulating layer, a turn-on or turn-off operation may be performed at a high speed and a parasitic capacitance between a gate electrode and an active layer may be reduced.

A passivation layer 107 is formed to cover the first and second source/drain electrodes 106sa and 106da, and 106sb and 106db of the first and second TFTs Ta and Tb. For surface planarization, an additional insulating layer may be further formed on the passivation layer 107.

The OLED is formed on the passivation layer 107. The OLED includes a first electrode 111, a second electrode 112, and an intermediate layer 114.

The first electrode 111 is formed on the passivation layer 107. The first electrode 111 is formed to be electrically connected to one of the first and second source/drain electrodes 106sa and 106da, and 106sb and 106db. A pixel-defining layer 109 is formed to cover the first electrode 111. A predetermined opening is formed in the pixel-defining layer 109, and then the intermediate layer 114 is formed on a region defined by the opening, wherein the intermediate layer 114 includes an organic emission layer. The second electrode 112 is formed on the intermediate layer 114.

The non-display region NDA of the display substrate 100 will now be described in detail with reference to FIGS. 1 and 4 through 7.

Referring to FIGS. 1 and 4 through 7, the non-display region NDA is a region on which an image is not displayed and on which various members for driving the display region DA and other modules are mounted. A driver IC (not shown), a pad unit 400, and the fan-out unit 200 for connecting the driver IC and the display region DA are formed on the non-display region NDA.

The driver IC is a chip on glass (COG) type and is mounted on the display substrate 100. The driver IC includes at its side a connection terminal (not shown) that is electrically connected to the pad unit 400 formed on the display substrate 100. The driver IC may include a data driving unit for supplying a data signal and may also include various function units required to drive the display region DA.

The pad unit 400 is formed on the display substrate 100 and is electrically connected to a connection terminal of the driver IC. The pad unit 400 includes first through third pads 211 through 213 respectively extending from first through third fan-out lines 201 through 203.

In some embodiments, the pad unit 400 may include at least one first pad 211, at least one second pad 212, and at least one third pad 213. The first through third pads 211 through 213 are distinguished based on layers of lines connected to them. That is, the first pad 211 is a pad extending from the first fan-out line 201 to be described below, and the second pad 212 is a pad extending from the second fan-out line 202 to be described below. The third pad 213 is a pad extending from the third fan-out line 203 to be described below. The first through third pads 211 through 213 form one pad group, and a plurality of pad groups are sequentially formed to form the pad unit 400. Accordingly, the pad unit 400 has a structure in which the first through third pads 211 through 213 are alternately formed.

The first pad 211 is formed at a first location of the non-display region NDA. The second pad 212 is formed at a second location of the non-display region NDA, which is not collinear with the first location in the X direction. The third pad 213 is formed at a third location of the non-display region NDA, which is not collinear with the first location and the second location in the X direction. Accordingly, the first through third pads 211 through 213 are not formed on the same straight line but are diagonally offset from each other. In this case, a width of one pad group in the X direction is less than that in a case when the first through third pads 211 through 213 are collinear in the X direction. According to an embodiment, since pads are diagonally offset, a large number of pads may be formed in a space having a small width W4 in the X direction and thus the dead space of the non-display region NDA may be reduced.

FIG. 7 is a cross-sectional view of the first pad 211. Referring to FIG. 7, the buffer layer 101 and the first gate insulating layer 113 are formed on the display substrate 100, and the first fan-out line 201 is formed thereon. An opening is formed in the second gate insulating layer 123 and the interlayer insulating layer 105 formed on the first fan-out line 201 so as to correspond to the first pad 211 and to expose the first fan-out line 201. A conductive layer 221 is formed on the exposed first fan-out line 201 in order to protect the first fan-out line 201 and to be electrically connected to a driver IC connection terminal. Here, the conductive layer 221 may include a low-resistance metal or a transparent conductive material. Although only the first pad 211 is illustrated in FIG. 7, the second and third pads 212 and 213 also have a structure in which an opening is formed in an insulating layer formed on a line, and a conductive layer is formed on the line exposed by the opening. However, in the second and third pads 212 and 213, a layer of the line is different from that in the first pad 211. The layer of the line will be described below together with the fan-out unit 200.

The fan-out unit 200 includes a plurality of fan-out lines for connecting the pad unit 400 and the display region DA. The fan-out lines include the first through third fan-out lines 201 through 203 according to layers at which they are formed. One first fan-out line 201, one second fan-out line 202, and one third fan-out line 203 form one line group. A plurality of line groups are sequentially formed to form the fan-out unit 200. Accordingly, the fan-out unit 200 has a structure in which the first through third fan-out lines 201 through 203 are alternately formed.

The first fan-out line 201 is formed on the first gate insulating layer 113 at the same layer as and by using the same material as the first gate line GL1. An end of the first fan-out line 201 is connected to the first pad 211 and the other end thereof is connected to the first data line DLr. The first fan-out line 201 may transmit the first data signal from the driver IC to the first data line DLr.

The second fan-out line 202 is formed on the second gate insulating layer 123 at the same layer as and by using the same material as the second gate line GL2. One end of the second fan-out line 202 is connected to the second pad 212 and the other end thereof is connected to the second data line DLg. The second fan-out line 202 may transmit the second data signal from the driver IC to the second data line DLg.

The first and second fan-out lines 201 and 202 are insulated from each other by the second gate insulating layer 123 and are formed at different layers. The first and second fan-out lines 201 and 202 do not overlap with each other. Because, since the thickness d2 of the second gate insulating layer 123 formed between the first and second fan-out lines 201 and 202 is relatively small, if the first and second fan-out lines 201 and 202 overlap with each other, a parasitic capacitance in a line region is increased.

The third fan-out line 203 is formed on the interlayer insulating layer 105 at the same layer as and by using the same material as the first through third data lines DLr, DLg, and DLb. One end of the third fan-out line 203 is connected to the third pad 213 and the other end thereof is connected to the third data line DLb. The third fan-out line 203 may transmit the third data signal from the driver IC to the third data line DLb.

In some embodiments, the third fan-out line 203 may overlap with one or more of the first and second fan-out lines 201 and 202. In FIGS. 4 through 6, the third fan-out line 203 partially overlaps with both the first and second fan-out lines 201 and 202. In more detail, the third fan-out line 203 overlaps with the first fan-out line 201 by V1 and overlaps with the second fan-out line 202 by V2. However, the above case is exemplarily described. The third fan-out line 203 may overlap with only one of the first and second fan-out lines 201 and 202. and may completely, not partially, overlap.

The interlayer insulating layer 105 is formed between the third fan-out line 203 and the first and second fan-out lines 201 and 202. Different from the first and second gate insulating layers 113 and 123, the interlayer insulating layer 105 has a large thickness. Accordingly, since a parasitic capacitance generated when the third fan-out line 203 overlaps with the first and second fan-out lines 201 and 202 is small, overlapping is allowed.

According to an embodiment, unlike a conventional case when fan-out lines are formed at the same layer, since fan-out lines are distributively formed at three different layers, a width of a fan-out unit in an X direction may be reduced. In particular, since at least one of lines that are distributively formed at three layers overlaps with the others, a dead space may be reduced and a larger number of lines may be formed in a fan-out unit. Accordingly, a larger number of lines may be formed on the same area and a high-resolution display apparatus may be formed. Also, even in a high-resolution display apparatus to which a multiplexer (MUX) may not be easily applied, a dead space may be reduced and a large display region may be achieved to a level of a case when a 3:1 MUX is used. Here, the 3:1 MUX refers to a MUX for reducing three lines into one line. Also, even in a small panel, a high resolution may be achieved.

The first through third fan-out lines 201 through 203 included in one line group transmit signals to different types of pixels. The same fan-out lines included in a plurality of line groups and formed at the same layer transmit signals to the same type of pixels.

As described above, the first through third fan-out lines 201 through 203 respectively transmit the first through third data signals. Here, the first through third data signals are used to distinguish data signals applied to different types of sub pixels.

In some embodiments, the first through third fan-out lines 201 through 203 may be formed as a single or multiple layers including one or more materials selected from the group consisting of molybdenum (Mo), aluminum (Al), copper (Cu), silver (Ag), titanium (Ti), and transparent conductive oxide (TCO). Here, TCO may include at least one selected from the group consisting of indium tin oxide (ITO), indium zinc oxide (IZO), zinc oxide (ZnO), indium oxide ($In_2O_3$), indium gallium oxide (IGO), and aluminium zinc oxide (AZO).

However, the first through third fan-out lines 201 through 203 included in one line group may include different materials and each of them may include at least one material. The same fan-out lines included in a plurality of line groups and formed at the same layer may include the same material. For example, the first fan-out line 201 may be formed as a single layer of Mo, the second fan-out line 202 may be formed as a double layer of Mo/Al, and the third fan-out line 203 may be formed of a triple layer of Ti/Al/Ti. Alternatively, the first fan-out line 201 may be formed as a double layer of Mo/Al, the second fan-out line 202 may be formed as Ag/ITO, and the third fan-out line 203 may be formed as a triple layer of Ti/Al/Ti.

According to an embodiment, since fan-out lines formed at different layers and including different materials are applied to pixels for emitting different colors of light, a continuity in resistance variation may be ensured. A resistance of a line is determined as represented in Equation 1 below. Here, S is a cross-sectional area of a line, ρ is a specific resistance of a line material, and L is a length of the line.

$$R = \rho \frac{L}{S} \quad \text{[Equation 1]}$$

That is, the resistance of the line is influenced by the specific resistance of the line material. For example, if fan-out lines for applying data signals to red pixels are formed of different line materials according to the red pixels, voltage drops of the red pixels according to line resistances are different and discontinuous. Accordingly, since the fan-out lines corresponding to the red pixels have resistance characteristics that vary discontinuously, a reduction in image quality, for example, a stain, distinguishable with the naked eye, may occur. However, according to an embodiment, since the first fan-out lines 201 for applying data signals to red pixels are formed of the same line material and thus have continuous resistance characteristics according to the red pixels, a reduction in image quality distinguishable with the naked eye will not occur.

The passivation layer 107 is formed on the third fan-out lines 203 of the fan-out unit 200 so as to achieve surface planarization and to protect lower lines. Here, the passivation layer 107 may include an inorganic material such as silicon oxide or silicon nitride or may include one or more organic materials selected from the group consisting of polyimide, polyamide, an acrylic resin, benzocyclobutene, and a phenolic resin.

As described above, according to an embodiment, since fan-out lines are distributively formed at three different layers and at least one of them is formed to at least partially overlap with the other lines, a dead space may be reduced. Accordingly, a fan-out unit may be easily designed in a small panel or a high-resolution display apparatus.

Also, the fan-out lines at different layers transmit signals to different pixels. As such, a resistance deviation of signals applied to the same type of pixels due to different line materials may be easily compensated by removing it.

The above embodiments are presented for illustrative purposes only, and are not intended to define meanings or limit the scope of the present invention as set forth in the following claims. Those skilled in the art will understand that various modifications and equivalent embodiments of the present invention are possible without departing from the spirit and scope of the present invention defined by the appended claims.

What is claimed is:

1. A display apparatus comprising:
    a display substrate divided into a display region configured to display an image via a plurality of pixels configured to emit light, and a non-display region surrounding the display region;
    a pad unit formed on the non-display region; and
    a fan-out unit configured to connect the display region and the pad unit, wherein the fan-out unit comprises a plurality of line groups sequentially formed, and wherein each of the line groups comprises a first fan-out line, a second fan-out line insulated from the first fan-out line by a first insulating layer, and a third fan-out line insulated from the second fan-out line by a second insulating layer,
    wherein the third fan-out line at least partially overlaps the first and second fan-out lines.

2. The display apparatus of claim 1, wherein the first through third fan-out lines are alternately formed.

3. The display apparatus of claim 1, wherein the first through third fan-out lines are configured to transmit signals to different types of pixels.

4. The display apparatus of claim 1, wherein the first, second, and third fan-out lines of each line group are respectively i) formed in the same layer and ii) configured to transmit signals to the same type pixels as the first, second, and third fan-out lines of the remaining line groups.

5. The display apparatus of claim 1, wherein the pad unit comprises:
    a first pad connected to the first fan-out line;
    a second pad connected to the second fan-out line; and
    a third pad connected to the third fan-out line, wherein the first through third pads are formed diagonally offset from each other.

6. The display apparatus of claim 1, wherein the first, second, and third fan-out lines are formed in different layers.

7. The display apparatus of claim 1, further comprising a third insulating layer formed to cover the third fan-out line.

8. The display apparatus of claim 7, wherein the third insulating layer is formed on the display region, and wherein the display apparatus further comprises a display device formed on the third insulating layer of the display region.

9. The display apparatus of claim 1, wherein the first through third fan-out lines comprise one or more materials selected from the group consisting of molybdenum (Mo), aluminum (Al), copper (Cu), silver (Ag), titanium (Ti), and transparent conductive oxide (TCO).

10. The display apparatus of claim 9, wherein the first through third fan-out lines comprise different materials and wherein each of the first through third fan-out lines comprises at least one material.

11. The display apparatus of claim 9, wherein the same fan-out lines in each of line groups are formed of the same material.

12. The display apparatus of claim 1, wherein the display region comprises:
a plurality of first gate lines extending in a first direction;
a plurality of second gate lines insulated from the first gate lines by the first insulating layer and extending in the first direction; and
a plurality of data lines insulated from the second gate lines by the second insulating layer and extending in a second direction, wherein the second direction crosses the first direction, and
wherein each of the first through third fan-out lines is electrically connected to one of the data lines.

13. The display apparatus of claim 5, wherein the first fan-out line is formed at the same layer as the first gate line, the second fan-out line is formed at the same layer as the second gate line, and the third fan-out line is formed at the same layer as the data line.

14. The display apparatus of claim 5, wherein the pixels are formed at intersections where the first gate lines cross the data lines and where the second gate lines cross the data lines,
wherein each of the pixels comprises a first pixel configured to emit light of a first color, a second pixel configured to emit light of a second color, and a third pixel configured to emit light of a third color, and
wherein the first fan-out line is electrically connected to the data line of the first pixel, the second fan-out line is electrically connected to the data line of the second pixel, and the third fan-out line is electrically connected to the data line of the third pixel.

15. The display apparatus of claim 6, wherein the first fan-out line is configured to transmit a first data signal, the second fan-out line is configured to transmit a second data signal, and the third fan-out line is configured to transmit a third data signal.

16. An organic light-emitting display apparatus comprising:
a display substrate divided into a display region configured to display an image, and a non-display region surrounding the display region;
a plurality of first gate lines formed on the display region and extending in a first direction;
a plurality of second gate lines formed on the display region, insulated from the first gate lines by a first insulating layer, and extending in the first direction;
a plurality of data lines formed on the display region, insulated from the second gate lines by a second insulating layer, and extending in a second direction, wherein the second direction crosses the first direction;
a plurality of pixels, wherein each of the pixels comprises a pixel circuit unit that is electrically connected to the first or second gate line and the data line;
an organic light-emitting device (OLED) included in each of the pixels, that is electrically connected to the pixel circuit unit, and configured to emit light;
a pad unit formed on the non-display region; and
a fan-out unit configured to connect the display region and the pad unit and comprising a plurality of line groups sequentially formed and each comprising a first fan-out line, a second fan-out line insulated from the first fan-out line by the first insulating layer, and a third fan-out line insulated from the second fan-out line by the second insulating layer,
wherein the third fan-out line at least partially overlaps at least one of the first and second fan-out lines.

17. The organic light-emitting display apparatus of claim 16, wherein the first through third fan-out lines are alternately formed.

18. The organic light-emitting display apparatus of claim 16, wherein the pad unit comprises:
a first pad connected to the first fan-out line;
a second pad connected to the second fan-out line; and
a third pad connected to the third fan-out line, wherein the first through third pads are configured to be diagonally offset from each other.

19. The organic light-emitting display apparatus of claim 16 further comprising a third insulating layer configured to cover the third fan-out line and the pixel circuit unit.

20. The organic light-emitting display apparatus of claim 19, wherein the OLED is formed on the third insulating layer.

21. The organic light-emitting display apparatus of claim 16,
wherein each of the pixels comprises a first pixel configured to emit light of a first color, a second pixel configured to emit light of a second color, and a third pixel configured to emit light of a third color, and
wherein the first fan-out line is electrically connected to the data line of the first pixel, the second fan-out line is electrically connected to the data line of the second pixel, and the third fan-out line is electrically connected to the data line of the third pixel.

22. The organic light-emitting display apparatus of claim 21, wherein the first fan-out line is configured to transmit a first data signal, the second fan-out line is configured to transmit a second data signal, and the third fan-out line is configured to transmit a third data signal.

23. The organic light-emitting display apparatus of claim 16, wherein the first through third fan-out lines comprise one or more materials selected from the group consisting of molybdenum (Mo), aluminum (Al), copper (Cu), silver (Ag), titanium (Ti), and transparent conductive oxide (TCO).

24. The organic light-emitting display apparatus of claim 23, wherein the first through third fan-out lines comprise different materials, and wherein each of the first through third fan-out lines is formed of at least one material.

25. The organic light-emitting display apparatus of claim 24, wherein the same fan-out lines in the line groups are formed of the same material.

* * * * *